United States Patent [19]

Nakatani et al.

[11] Patent Number: 4,634,966

[45] Date of Patent: Jan. 6, 1987

[54] BINARY PROCESSING OF SOUND SPECTRUM

[75] Inventors: Tomofumi Nakatani, Yokohama; Shogo Nakamura, Matsudo, both of Japan

[73] Assignee: Ricoh Company, Ltd., Tokyo, Japan

[21] Appl. No.: 713,431

[22] Filed: Mar. 19, 1985

[30] Foreign Application Priority Data

Mar. 22, 1984 [JP] Japan ................... 59-55478

[51] Int. Cl.⁴ ........................... G01R 23/16
[52] U.S. Cl. ................... 324/77 B; 324/77 R
[58] Field of Search ........... 324/77 R, 77 B, 77 C, 324/77 CS, 78 D, 79 D, 77 D; 328/140; 364/485, 487, 571; 375/10

[56] References Cited

U.S. PATENT DOCUMENTS

| | | | |
|---|---|---|---|
| 3,881,097 | 4/1975 | Lehmann | 324/77 D |
| 4,015,087 | 3/1977 | Stewart | 324/77 B |
| 4,084,245 | 4/1978 | Bunge | 364/485 |
| 4,093,988 | 6/1978 | Scott | 324/77 B |
| 4,344,031 | 8/1982 | Kuhn et al. | 324/77 R |
| 4,348,637 | 9/1982 | Hayes, III et al. | 324/77 C |

*Primary Examiner*—Michael J. Tokar
*Attorney, Agent, or Firm*—Cooper, Dunham, Griffin & Moran

[57] ABSTRACT

A frequency spectral distribution of sound signal has a plurality of discrete data at respective channels where sampling takes place. Such a spectral distribution, defining a parallel signal, is converted into a time series signal which is used to produce a peak-detected signal and a zero-cross signal. Then, based on the timing of the zero-cross signal, the peak-detected signal is compared with the original parallel signal to process the original parallel signal to be binary-valued. The present invention provides a simple hardware structure having the above-described function.

3 Claims, 15 Drawing Figures

FIG. 1a
FIG. 1b
FIG. 1c
FIG. 1d
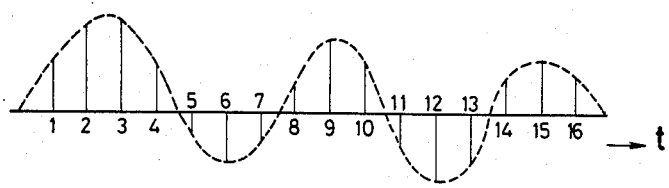
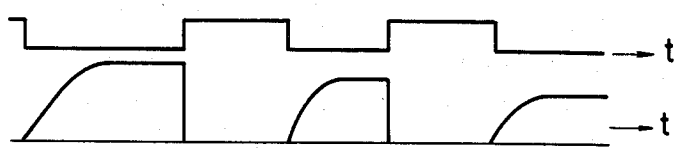
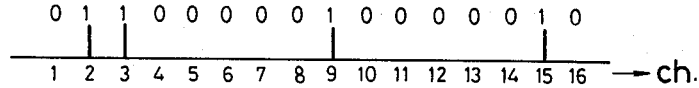
FIG. 2
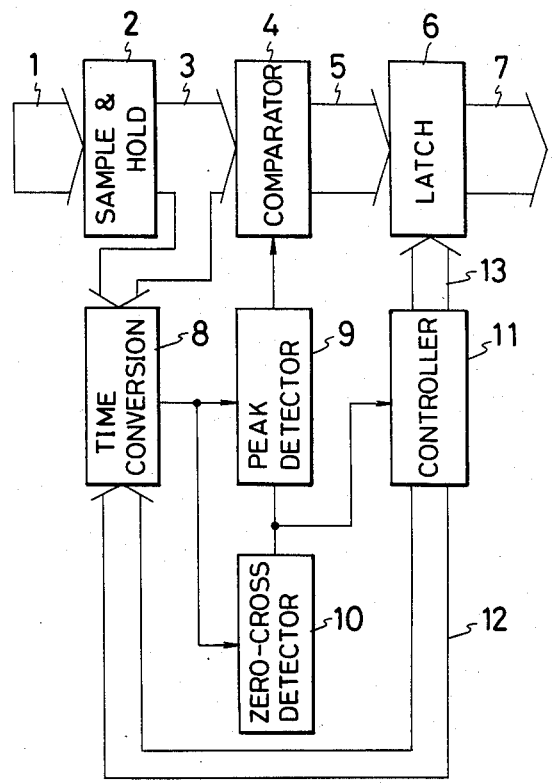

BINARY PROCESSING OF SOUND SPECTRUM

BACKGROUND OF THE INVENTION

1. Field of the Invention

The present invention generally relates to a system of converting a parallel signal having a multiple of values at a point in time into a binary signal, and, in particular, to a system of processing a parallel signal, such as sound spectral distribution, to be binary-valued.

2. Description of the Prior Art

It has been known to process a sound spectral distribution, obtained from a sound signal, for example, by having the sound signal subjected to frequency spectral analysis by a filter bank, to produce a frequency pattern arranged in timed sequence, thereby finding local peaks or the like through a binary processing technique. In this case, however, such processing has been carried out by computers. Since sound signal processing has recently attracted much attention, there has been a need to develop a hardware structure which can implement binary processing of sound spectrum effectively and efficiently.

SUMMARY OF THE INVENTION

It is therefore a primary object of the present invention to obviate the disadvantages of the prior art as described above and to provide a system of binary processing of sound spectrum.

Another object of the present invention is to provide a system of converting a sound signal into a binary signal which is particularly suited for use in a sound recognition apparatus.

Other objects, advantages and novel features of the present invention will become apparent from the following detailed description of the invention when considered in conjunction with the accompanying drawings.

BRIEF DESCRIPTION OF THE DRAWINGS

FIGS. 1a through 1d are waveform diagrams which are useful for explaining the principle of the present invention;

FIG. 2 is a block diagram showing the sound signal binary processing system constructed in accordance with one embodiment of the present invention;

DESCRIPTION OF THE PREFERRED EMBODIMENTS

Figure 3:
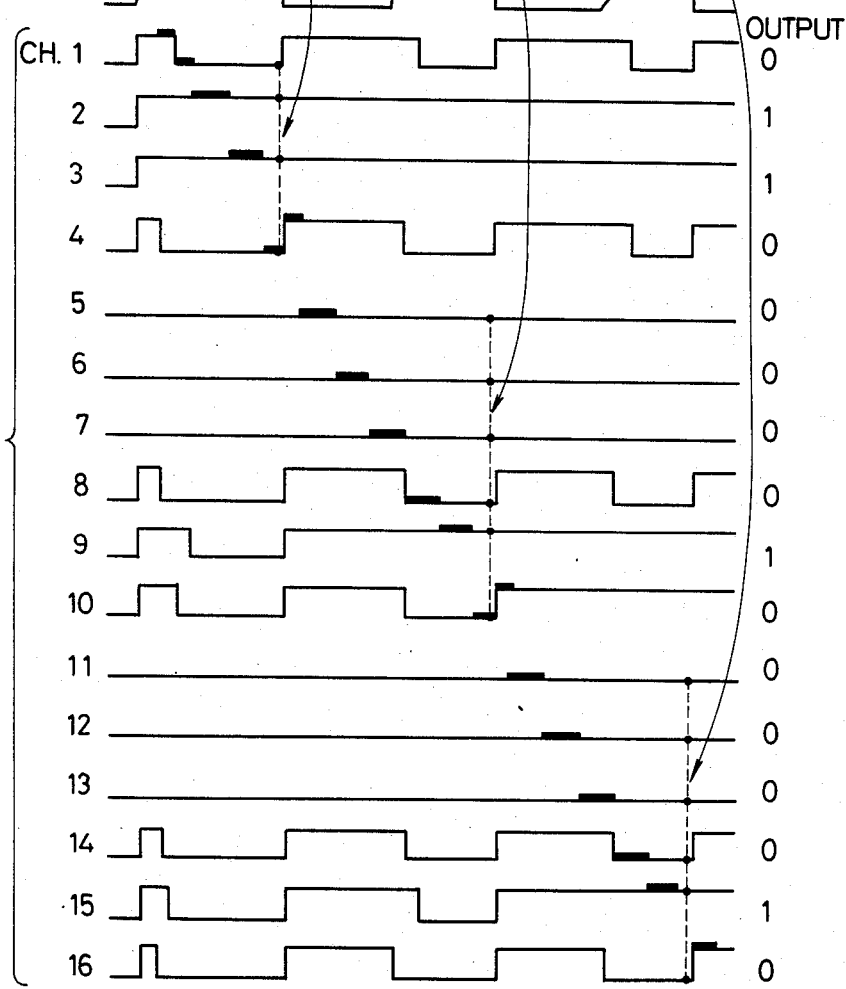
FIGS. 3a through 3d are waveform diagrams which are useful for explaining the operation of the system shown in FIG. 2.

Referring now to FIGS. 1a–1d, the principle of the present invention will first be described with respect to the case in which local peaks in the frequency spectral distribution obtained by processing a sound signal through a filter bank having a predetermined number of channels are detected and then the spectral distribution is converted into a binary sound signal. If a frame of a sound signal processed by a filter bank having, for example, sixteen channels is rearranged in timed sequence at a predetermined time interval, there is obtained a waveform as indicated in FIG. 1a. Then, if the waveform of FIG. 1a is converted into a zero-cross waveform such that the zero-cross waveform remains at low level while the waveform of FIG. 1a is positive, there is obtained a zero-cross waveform as shown in FIG. 1b. Then, if the zero-cross waveform of FIG. 1b is processed such that it is set and reset by the falling and rising edges of the zero-cross waveform, respectively, then there is obtained a peak-detected waveform as shown in FIG. 1c. Under the condition, during the period in which the waveform of FIG. 1a is positive, if the peak of waveform of FIG. 1a is compared with the peak-detected waveform of FIG. 1c to determine as to whether the former is equal to or greater than the latter, there is obtained a binary signal which is "1" only for the channel having a local peak, as shown in FIG. 1d. It should be noted that in the above-described example use has been made of the peak as a threshold for binary conversion process, but use may also be made of a predetermined threshold or a threshold determined by a predetermined percentage of the corresponding peak.

FIG. 2 shows in block form the binary processing system constructed in accordance with one embodiment of the present invention on the basis of the principle set forth above with reference to FIGS. 1a–1d. As shown, the illustrated system receives an output signal from a filter bank (not shown) through a line 1, which is typically a parallel signal including a plurality (sixteen in the illustrated example) of discrete components arranged as spaced apart from one another at an interval, for example, of 5–30 milliseconds. In the illustrated example, there are sixteen components corresponding to the number of channels provided in the filter bank. In order to detect local peaks of this signal, the signal must first be converted into a time series signal. For this purpose, the system includes a sample and hold circuit 2 which samples and holds the parallel signal over a period of time during which peak detection is carried out.

Also provided in the system of FIG. 2 is a level comparator 4 which compares the sampled value with an output from a peak detector 9 and supplies a high signal if the sampled value has been found to be larger. The output from the comparator 4 is then latched into a latch 6 which is operated in accordance with a latch signal supplied from a controller 11. Thus, there is obtained a parallel signal defined by binary data as shown in FIG. 1d from the latch 6.

On the other hand, the output from the sample and hold circuit 2 is also supplied to a time conversion circuit 8 where the parallel signal is converted into a time series signal. The timing of such conversion into a time series signal is determined on the basis of a control signal supplied from the controller 11 via line 12. It will be appreciated that the control circuit 11 may be formed easily from an analog multiplexer. The time conversion circuit 8 supplies its output to the peak detector 9 and to a zero-cross detector 10. The peak detector 9 supplies as its output a signal of the form indicated in FIG. 1c and the zero-cross detector 10 supplies as its output a signal of the form indicated in FIG. 1b. The zero-cross detector 10 supplies its zero-cross signal to the peak detector 9 and also to the control circuit 11 to be used as its reset signal.

The operation of the system shown in FIG. 2 will be described with reference to the timing shown in FIGS. 3a–3d. It is to be noted that FIGS. 3a–3c correspond to FIGS. 1a–1c. In FIG. 3d, the timing of control signal and the point in time when the data are latched are shown as superimposed on the output from each channel of the comparator 4. Furthermore, the fat line segments shown in FIG. 3d indicate the timing of channel selection signals for the corresponding channel, and for those channel signals having the channel selection signals in the same low level period of the zero-cross signal, the output signals from the level comparator 4 are latched at the same time at the rising edge of the zero-cross signal. The point in time when such latching operation takes place is indicated by black dots in FIG. 3d. This process is repeated in sequence to have all of the outputs from the sixteen channels of the comparator 4 are latched, as shown in FIG. 3d.

Figure 4:
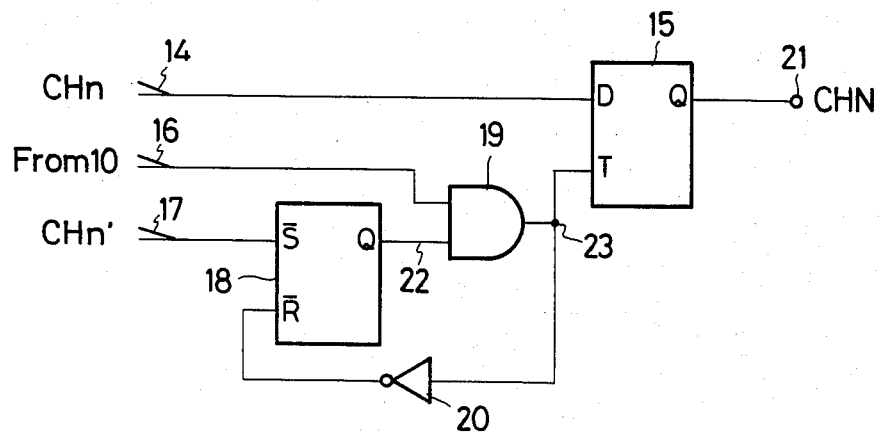
FIG. 4 is a block diagram showing the detailed structure of the latch circuit provided in the structure shown in FIG. 2.

FIG. 4 shows in block form the detailed structure of the latch circuit 6 provided in the system of FIG. 2. The structure shown in FIG. 4 is for the sixteenth channel, but it is to be noted that the similar structure is provided for each of the remaining channels. As shown in FIG. 4, it receives one output signal from the comparator 4 through a line 14 and this signal is supplied to the D input of D latch circuit 15. It also receives an output signal from the zero-cross detector 10 through a line 16, and this signal is supplied to one input of AND circuit 19. It also receives a channel selection signal, and this signal is supplied to $\bar{S}$ input of R-S flipflop circuit 18. An output signal from the Q output of flipflop 18 is supplied to the remaining input of AND circuit 19. AND circuit 19 is connected to supply its output to the T input of latch circuit 15 and to the $\bar{R}$ input of flipflop 18 through an inverter 20.

Figure 5A:
FIGS. 5a through 5e are waveform diagrams which are useful for explaining the operation of the structure shown in FIG. 4.
Figure 5B:
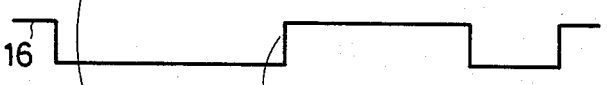
Figure 5C:
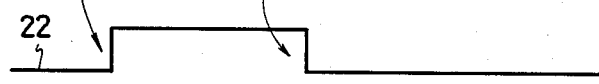
Figure 5D:
Figure 5E:
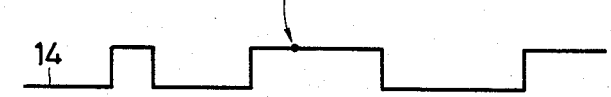

The operation of the structure shown in FIG. 4 will now be described with particular reference to FIGS. 5a–5e. It is to be noted that FIGS. 5a–5e show waveforms at points 17, 16, 22, 23 and 14 indicated in FIG. 4, respectively. With the falling edge of waveform 17 shown in FIG. 5a, the R-S flipflop circuit 18 is turned on and, with rising edge of waveform 16 shown in FIG. 5b, the $\bar{R}$ input terminal of R-S flipflop circuit 18 is turned off, so that there is obtained a waveform 22 shown in FIG. 5c. Accordingly, an output signal 23 from AND circuit 19 takes the waveform as shown in FIG. 5d, and when the rising edge of waveform 23 is applied to the T input terminal of D latch circuit 15, the waveform shown in FIG. 5e is latched.

An example has been described for the case in which a peak value is detected for carrying out the binary processing. Alternatively, it is also possible to weight the peak value and to carry out the binary processing using the weighted peak value as a threshold.

As may have been already understood, in accordance with the present invention, there is provided a hardware structure which can carry out the detection of the location of a signal whose level is equal to or higher than a threshold by comparing the levels of parallel data occurring at the same time, such as a frequency spectral distribution of a sound signal. Furthermore, in accordance with the present invention, a plurality of data sampled at the same time (and thus not time-dependent) can be converted into a time series signal which is arranged in timed sequence and thus can be processed sequentially one after another, and, therefore, the comparison of data can be carried out using a simple structure. More specifically, the present invention provides a simple hardware structure which processes a sound signal to be binary-valued.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A system of processing a spectrum of sound to be binary-valued, comprising:
    sample and hold means for sampling and holding a parallel signal of said spectrum of sound;
    converting means for converting said parallel signal into a time series signal;
    peak detecting means for detecting a peak of said time series signal and for producing a peak-detected signal;
    zero-cross detecting means for detecting zero-crossing of said time series signal and for producing a zero-cross signal;
    comparing means for comparing the level of said parallel signal with the level of said peak-detected signal and for supplying a binary output signal as a result of a comparison using said peak-detected signal as a threshold;
    means for supplying a control signal in association with said zero-cross signal; and
    latching means for latching the binary output signal from said comparing means in accordance with said control signal.

2. The system of claim 1 wherein said peak-detected signal is weighted for use as a threshold.

3. The system of claim 1 wherein those portions of said parallel signal which reside in a time period while said zero-cross signal is at a selected one of the low and high level are latched at the same time by said zero-cross signal.

* * * * *